(12) United States Patent
Anderson et al.

(10) Patent No.: US 6,861,273 B2
(45) Date of Patent: Mar. 1, 2005

(54) METHOD OF FABRICATING REFLECTION-MODE EUV DIFFUSERS

(75) Inventors: Erik Anderson, El Cerrito, CA (US); Patrick P. Naulleau, Oakland, CA (US)

(73) Assignee: EUV LLC, Santa Clara, CA (US)

( * ) Notice: Subject to any disclaimer, the term of this patent is extended or adjusted under 35 U.S.C. 154(b) by 672 days.

(21) Appl. No.: 09/846,150

(22) Filed: Apr. 30, 2001

(65) Prior Publication Data

US 2002/0160545 A1 Oct. 31, 2002

(51) Int. Cl.$^7$ .................. H01L 21/00; C23F 1/00; G03C 9/00; G02B 5/20
(52) U.S. Cl. ................ 438/30; 438/22; 438/29; 438/32; 430/5; 430/322; 216/2; 216/41; 359/360; 359/572
(58) Field of Search .................. 359/36, 572, 576, 359/566, 548, 585; 438/22, 30, 29, 32; 216/2, 21, 41; 430/5, 322

(56) References Cited

U.S. PATENT DOCUMENTS

| | | | |
|---|---|---|---|
| 5,789,124 A | 8/1998 | Todd | |
| 5,989,776 A * | 11/1999 | Felter et al. | 430/270.1 |
| 6,033,766 A | 3/2000 | Block et al. | |
| 6,048,652 A * | 4/2000 | Nguyen et al. | 430/5 |
| 6,080,533 A | 6/2000 | Huggins | |
| 6,090,528 A | 7/2000 | Gordon et al. | |
| 6,150,060 A | 11/2000 | Vernon | |
| 6,150,232 A | 11/2000 | Chan et al. | |
| 6,159,643 A * | 12/2000 | Levinson et al. | 430/5 |
| 6,169,039 B1 | 1/2001 | Lin et al. | |
| 6,178,221 B1 | 1/2001 | Levinson et al. | |
| 6,392,792 B1 * | 5/2002 | Naulleau | 359/360 |
| 6,577,442 B2 * | 6/2003 | Goldstein | 359/361 |
| 2004/0151988 A1 * | 8/2004 | Silverman | 430/5 |

* cited by examiner

*Primary Examiner*—Matthew Smith
*Assistant Examiner*—Igwe U. Anya
(74) *Attorney, Agent, or Firm*—Fliesler Meyer LLP

(57) ABSTRACT

Techniques for fabricating well-controlled, random relief, engineered surfaces that serve as substrates for EUV optical devices are accomplished with grayscale exposure. The method of fabricating a multilevel EUV optical element includes: (a) providing a substrate; (b) depositing a layer of curable material on a surface of the substrate; (c) creating a relief profile in a layer of cured material from the layer of curable material wherein the relief profile comprises multiple levels of cured material that has a defined contour; and (d) depositing a multilayer reflection film over the relief profile wherein the film has an outer contour that substantially matches that of the relief profile. The curable material can comprise photoresist or a low dielectric constant material.

66 Claims, 2 Drawing Sheets

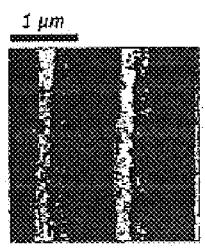 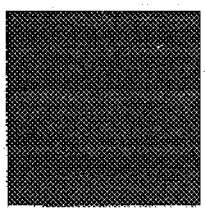 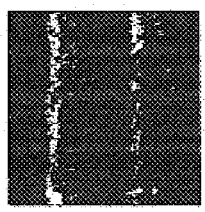 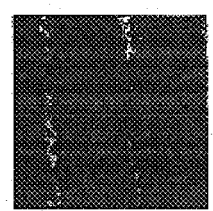
FIG. 6A          FIG. 6B          FIG. 6C          FIG. 6D
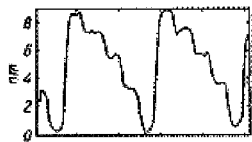 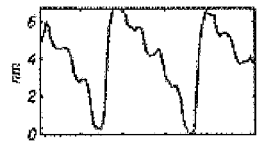 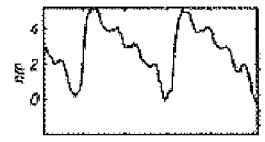 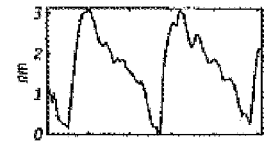
FIG. 7A          FIG. 7B          FIG. 7C          FIG. 7D
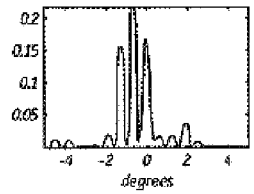 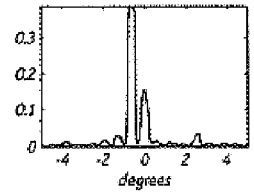 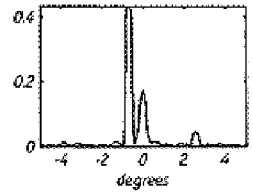 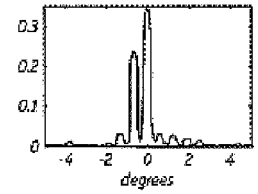
FIG. 8A          FIG. 8B          FIG. 8C          FIG. 8D

METHOD OF FABRICATING REFLECTION-MODE EUV DIFFUSERS

The U.S. Government has certain rights in this invention pursuant to Contract No. DE-AC03-76SF00098 between the United States Department of Energy and the University of California for the operation of the Lawrence Berkeley National Laboratory.

FIELD OF THE INVENTION

The invention relates to high-efficiency multilevel optical elements and particularly to fabrication techniques that produce a well-controlled, random relief, engineered surfaces by electron beam exposure having a spatially varying dose on a layer of curable material (e.g, low dielectric constant material) and partially clearing uncured portions.

BACKGROUND OF THE INVENTION

Diffusers play a very important role in the realm of optics. These devices are often used as integral parts of illumination systems for a wide range of optical devices. With the advent of multilayer reflectors, optical systems have been pushing towards ever-shorter wavelengths. Recently, extreme ultraviolet (EUV) wavelength systems have attracted significant interest due to their applicability to next-generation projection lithography for semiconductor manufacturing. It would be highly desirable to have diffusers for this new area of optics. In visible-light systems, diffusers are typically based on rough transmission devices that impart a spatially random phase shift on the light by virtue of the light passing through random lengths of phase shifting material. This is convenient at visible wavelengths because numerous materials, such as glass, exist that provide strong phase shift with negligible attenuation relative to free space. At EUV, however, such materials are hard to find. It is, therefore, preferable to use reflection diffusers at EUV wavelengths. A reflection diffuser at EUV can be, in principle, produced by depositing an EUV reflective multilayer onto a rough substrate. The spatially random surface height acts to impart a random phase shift upon reflection, diffusing the light. To achieve adequate efficiency, however, the roughness of the substrate must be well controlled. Experience has shown that naturally rough substrates do not provide enough control for the fabrication of effective EUV diffusers. Practical EUV diffusers, thus, require the use of engineered random relief substrates. The art is in need of a fabrication method allowing arbitrary random relief substrates to be fabricated for use with EUV diffusers.

SUMMARY OF THE PRESENT INVENTION

The invention is based in part on the recognition that fabricating a well-controlled, random relief, engineered surface can be accomplished by grayscale exposure of curable materials and partially clearing the uncured material. The residual cured material acts as the controlled roughness substrate for the EUV multilayer based diffuser. For a typical EUV multilayer, if the features on the substrate are much larger than 50 nm, the multilayer will be conformal to the substrate. Thus the phase imparted to the reflexed wavefront will closely match that set by the surface height profile.

Accordingly, in one embodiment, the invention is directed to a method of fabricating a multilevel EUV optical element that includes:

(a) providing a substrate;

(b) depositing a layer of curable material on a surface of the substrate;

(c) creating a relief profile in a layer of cured material from the layer of curable material wherein the relief profile comprises multiple levels of cured material that has a defined contour; and (d) depositing a multilayer reflection film over the relief profile wherein the film has an outer contour that substantially matches that of the relief profile.

The curable material can, for instance, comprise photoresist with step (c) including the steps of:

(i) exposing the layer of photoresist to spatially varying doses of radiation; and (ii) developing the photoresist to generate a layer of partially-cleared photoresist.

Alternatively, the curable material comprises a low dielectric constant material with step (c) including the steps of:

(i) exposing the layer of low dielectric constant material to spatially varying doses of radiation to selectively modulate its dissolution rate with respect to a solvent; and (ii) dissolving the low dielectric constant material for a sufficient length of time such that a relief structure is produced in the low-dielectric-constant material, where the relief structure depth is proportional to the modulated dissolution rate in step (i).

Preferably, the low-dielectric-constant materials include, for example, one or more of spin-on-glass, benzocyclobutine, and/or hydrogen silsesquioxane. The radiation typically comprises electron beam radiation.

BRIEF DESCRIPTION OF THE DRAWINGS

FIGS. 6A, 6B, 6C, and 6D are AFM images of four sample gratings with heights that are relatively close to the ideal modulation height of a +1-order-blazed reflection grating;

FIGS. 7A, 7B, 7C, and 7D are average profiles for the four sample gratings of FIGS. 6A–6D, respectively; and FIGS. 8A, 8B, 8C, and 8D are the diffraction patterns for the four sample gratings of FIGS. 6A–6D, respectively (the undisturbed multilayer reflectivity has been normalized out of the diffraction plots).

DETAILED DESCRIPTION OF THE PREFERRED EMBODIMENT

Figure 1:
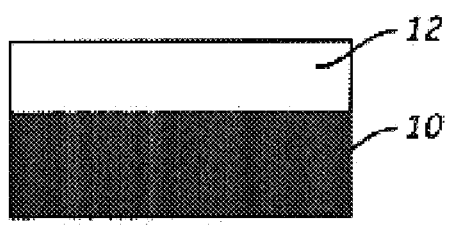
FIG. 1 illustrates a low dielectric constant material coated substrate.

FIG. 1 illustrates a layer 12 of curable material that is deposited on the upper surface of substrate 10. The substrate 10 serves as a support and can be made of any suitable superflat (<3 Angstrom rms roughness) material including, for example, silicon or glass. The term "curable material" is meant to encompass any suitable material that can be treated by radiation to impart different mechanical characteristics to those portions that have been treated. Particularly suited materials include low-dielectric-constant (low-k dielectric)

materials such as spin-on-glass (SOG), benzocyclobutine (BCB), and hydrogen silsesquioxanes (HSQ). Electron-beam curing of these materials adds moisture and thermal resistance as well as mechanical strength. Uncured portions of such low-k dielectric material can be removed by conventional solvents during development. Low-k dielectric materials are described, for example, in U.S. Pat. No. 6,169,039 which is incorporated herein. Other curable materials contemplated include positive and negative photoresists which are well known in the art. For the purpose of illustrating the invention, low-k dielectric constant material will be used although it is understood that other curable materials can be employed.

Figure 2:
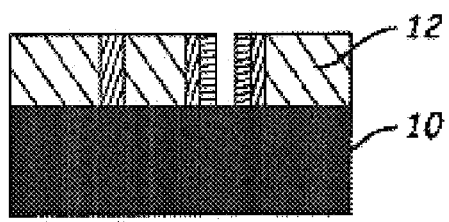
FIG. 2 illustrates the coated substrate after the low dielectric constant material has been exposed to a spatially varying electron-beam dose.

FIG. 2 illustrates the coated substrate assembly of FIG. 1 after the low-k dielectric material has been exposed to a spatially varying dose of E-beam radiation. Because the dose can take on a quasi-continuous range of values, this is also commonly known as grayscale exposure. One method of achieving this is to shield the upper surface of the low-k dielectric material 12 with a mask that has a pattern having varying transmission rates for the radiation. In this fashion, different parts of the low-k dielectric materials will be exposed to different levels of radiation.

Figure 3:
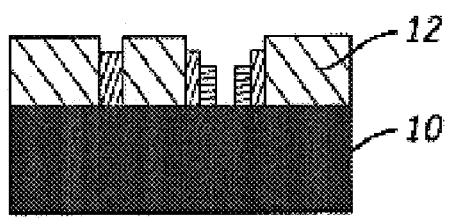
FIG. 3 illustrates the coated substrate after uncured parts of the low dielectric constant material have been removed to leave a partially-cleared layer.

FIG. 3 shows the coated substrate assembly of FIG. 2 after less cured portions of the low-k dielectric material have been removed. The side portions of the low-k dielectric material that are not removed are those that received a sufficient doses of radiation to be essentially completely cured whereas those portions that are removed to a greater extent received less. By this process, low-k dielectric layer 12 exhibits a relief profile that, in this case, has four discrete heights. With the present invention, one can vary the number of levels in the low-k dielectric material. Typically, the number of levels will range from 4 to 256 and preferably from about 8 to 32. The incremental height of each level will typically range from 0.1 nm to 10 nm and preferably from about 0.5 nm to 5 nm. The incremental heights of the levels are preferably substantially equal.

Figure 4:
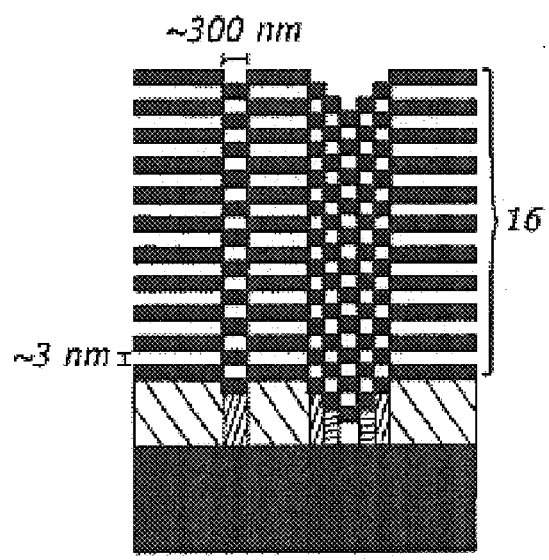
FIG. 4 illustrates a representative blazed grating.

FIG. 4 shows an overcoat of a multilayer reflection stack 16 that is formed over the structure of FIG. 3. It is important to note that the scale of the figure is greatly exaggerated for clarity; in reality the lateral feature size will be on the order of 100 times larger than the step height. For example in a typical EUV diffuser, the step height might be 3 nm whereas the lateral feature size would be about at least 300 nm.

The multilayer reflection stack 16 is designed to reflect at the wavelength of interest and is formed of alternating layers of two or more materials. Preferred materials include, for example, molybdenum (Mo), silicon (Si), tungsten (W), carbon (C), beryllium (Be), ruthenium (Ru), $B_4C$, $Mo_2C$, titanium (Ti), and vanadium (V). Preferred stacks are formed from alternating layers of two materials that are selected from the following list of seven pairs: Mo—Si, W—C, Mo—Be, Ru—$B_4C$, $Mo_2C$—Si, Ti—C, V—C. Alternating layers of Mo and Si are particularly preferred for EUV applications (e.g., on the order of 10 nm). The individual layers of the multilayer stack 16 are formed by conventional techniques such as magnetron or ion-beam sputtering.

It is understood that the number of bilayers and the materials used in the reflective multilayer can vary depending on the desired performance in terms of reflectivity and angular and temporal bandwidth. A larger number of layers will typically provide higher reflectivity at the cost of lower angular and temporal bandwidth. Overcoat 16 of FIG. 4 is depicted to have 10 bilayers. Typically, the number of layered pairs will range from about 10 to 200 and preferably from about 20 to 80. Moreover, the layer pairs will typically have a bilayer periodicity of about 2 nm to 100 nm and preferably from about 5 nm to 30 nm. By "periodicity" is meant the thickness of one bilayer. Typically, the height of the individual stack layers will range from about 0.2 to 0.8 times the total bilayer thickness and preferably from about 0.4 to 0.6 times the total bilayer thickness.

An ideal reflection diffuser has a random surface where the heights are continuously distributed with a Gaussian probability distribution. The standard deviation of the Gaussian height distribution should be slightly larger than one quarter of the wavelength of interest. Upon reflection, the standard deviation of the imparted phase will be slightly larger than $\pi$. Limiting the surface height variation to ±3 standard deviations sets a total peak-to-valley surface variation of approximately 24 nm for a diffuser operating at an EUV wavelength of 13.4 nm. These specifications can be met using spatially variable, continuous-dose exposures of low-k dielectric material providing adequate intrinsic roughness characteristics such as glass-based resists. The low-k dielectric material removal rate during development is proportional to the exposure dose, thus after development the spatially variable dose profile is mapped to a spatially variable height profile. Any non-linearities in the low-k dielectric material can be calibrated and compensated for by using non-linear dose mapping for the desired height profile. This method could, in principle, also be used for any EUV reflective diffraction element, however, intrinsic roughness limits become even more stringent for non-diffuser applications.

The above described preferred grayscale-exposure technique was employed to fabricate both diffusers and a variety of blazed gratings. The specific method used a grayscale e-beam exposure to produce continuous-height relief structures directly in a low-k dielectric material consisting of HSQ. In particular, for the gratings, this was achieved by defining a data set for the e-beam lithography tool that comprised a series of lines having 5 different exposure levels. The set of five lines was then replicated defining the extended grating. The various gratings of different heights were achieved by globally modifying the exposure levels in the data set. The data set was then used by the e-beam lithography tool as a map for the exposure pattern to be transferred to the HSQ-coated wafer. Actual exposure level control was achieved by modifying the dwell time of the electron beam at each pixel in the pattern. Thus, if part of the pattern is to have twice as much exposure as another part, the electron beam will generally stay on that part twice as long. Once the e-beam exposure dose was delivered to the HSQ-coated wafer, the wafer and HSQ were developed using standard techniques such that the HSQ was only partially cleared. Doing this assures that the height of the remaining HSQ on the surface will be proportional to the amount of exposure received. It is important to not overdevelop the HSQ as this will tend to remove too much material and the heights will no longer be proportional to exposure. In this case, any portion with an exposure level below some threshold would be washed away meaning that the achieved height profile would no longer match the desired profile. After creating the relief structure was created into the HSQ using the developmental process, the structure was overcoated with a conventional Mo/Si multilayer. The multilayer deposition was done by magnetron sputtering. The fabrication process for the diffusers is identical to that just described for the gratings, except for the definition of the data set used by the e-beam lithography tool to perform the exposure.

Figure 5:
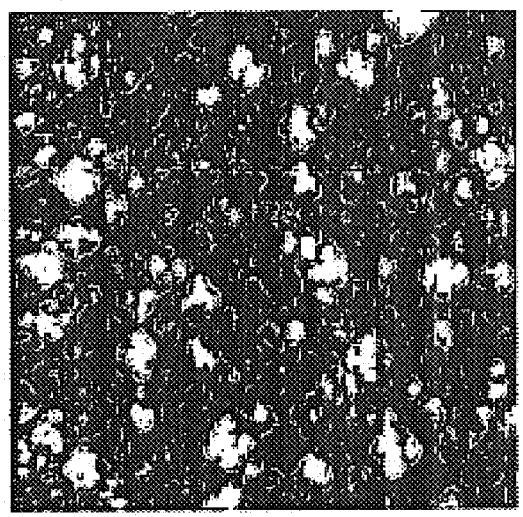
FIG. 5 is an Atomic Force Microscope (AFM) image of a fabricated EUV diffuser.

FIG. 5 is a plan Atomic Force Microscope (AFM) image of a multilevel diffuser showing the 2-dimensional characteristics of the pattern. In this image, brightness is proportional to height (the white areas are the highest.) The random checkerboard height pattern provides the diffusion upon reflection. The diffuser was fabricated as described above. The AFM image is over a 3 $\mu$m×3 $\mu$m area and the patterned diffuser cell size is approximately 250 nm. The higher-frequency roughness is undesired roughness related to the intrinsic roughness of the HSQ. This intrinsic roughness could be reduced using methods such as high-temperature annealing.

FIGS. 6A–6D and 7A–7D show AFM images and average profiles, respectively, for four sample gratings that had heights relatively close to the ideal modulation height for the +1-order-blaze condition at 13.4 nm radiation. Again the images are over a 3 $\mu$m×3 $\mu$m area and the individual line widths are approximately 250 nm. The five steps comprising the blaze pattern are evident. The average profile plots were generated directly from the corresponding AFM images by averaging along the direction of the lines. This has the effect of visually reducing the random intrinsic roughness and thus more clearly showing the achieved patterned height profile. In order to actually verify the performance of these devices as EUV diffraction elements, the gratings were characterized in an EUV reflectometer operating at Lawrence Berkeley National Laboratory's Advanced Light source synchrotron facility. FIGS. 8A–8D are the reflectometry results showing the far-field diffraction patterns from the gratings. As expected, the blaze efficiency is seen to be optimum at a blaze height near 6.7 nm ($\lambda/2$).

As demonstrated in FIG. 8C, a diffraction efficiency exceeding 40% has been obtained. Noting that this result comes from a simple 5-level grating with non-optimized step sizes, exceeding diffraction efficiencies of 50% seems well within range. Also possibly limiting the diffraction efficiency measured here is intrinsic roughness in the low-k dielectric material. This effect might be reduced through the use of ion beam sputtering as opposed to the magnetron sputtering used for the multilayers studied here.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A method of fabricating a multilevel EUV optical element comprising:
   (a) providing a substrate;
   (b) depositing a layer of curable material on a surface of the substrate;
   (c) creating a relief profile in a layer of cured material from the layer of curable material wherein the relief profile comprises multiple levels of cured material that has a defined contour wherein the number of levels in the cured material is at least about 3; and
   (d) depositing a multilayer reflection film over the relief profile wherein the film has an outer contour that substantially matches that of the relief profile.

2. The method of claim 1 wherein the multilayer reflection film comprises alternating layers of a first material having a refractive index and a second material having a different refractive index than the first material.

3. The method of claim 1 wherein the multilayer reflection film comprises about 10 to 200 layer pairs.

4. The method of claim 3 wherein the layer pairs have a periodicity of about 2 nm to 100 nm.

5. The method of claim 1 wherein the multilayer reflection film comprises alternating layers of molybdenum and silicon.

6. The method of claim 5 wherein the multilayer reflection film comprises about 10 to 200 layer pairs.

7. The method of claim 6 wherein the layer pairs have a periodicity of about 2 nm to 100 nm.

8. The method of claim 1 wherein the curable material comprises photoresist and step (c) comprises the steps of:
   (i) exposing the layer of photoresist to spatially varying doses of radiation; and
   (ii) developing the photoresist to generate a layer of partially-cleared photoresist.

9. The method of claim 8 wherein the radiation comprises electron beam radiation.

10. The method of claim 1 wherein the curable material comprises a low dielectric constant material and step (c) comprises the steps of:
    (i) exposing the layer of low dielectric constant material to spatially varying doses of radiation to selectively modulate its dissolution rate with respect to a solvent; and p1 (ii) dissolving the low dielectric constant material for a sufficient length of time such that a relief structure is produced in the low-dielectric-constant material, where the relief structure depth is proportional to the modulated dissolution rate in step (i).

11. The method of claim 10 wherein the low dielectric constant material is selected from the group of materials consisting of spin on glass, benzocyclobutine, and hydrogen silsesquioxane.

12. The method of claim 11 wherein the radiation comprises electron beam radiation.

13. The method of claim 1 wherein the incremental height of each level of the multiple levels of the cured material ranges from 1 nm to 20 nm.

14. The method of claim 1 wherein the number of levels in the cured material is in the range of about 3 to 31.

15. The method of claim 1 wherein the incremental step heights of the relief profile in the layer of cured material are small relative to the intrinsic roughness of the cured material.

16. An EUV device including a multilevel element that comprises:
    (a) a substrate having a layer of a cured material deposited on a surface of the substrate wherein the layer of cured material defines a relief profile comprising multiple levels of cured material that has a defined contour wherein the number of levels is at least about 3; and
    (b) a multilayer reflection film that covers the relief profile wherein the film has a contour that substantially matches that of the relief profile.

17. The device of claim 16 wherein the multilayer film comprises alternating layers of a first material having a refractive index and a second material having a refractive index than is different from that of the first material.

18. The device of claim 16 wherein the multilayer reflection film comprises alternating layers of molybdenum and silicon.

19. The device of claim 18 wherein the multilayer reflection film comprises about 10 to 200 layer pairs.

20. The device of claim 19 wherein the layer pairs have a periodicity of about 2 nm to 100 nm.

21. The device of claim 16 wherein the multilayer reflection film comprises about 10 to 200 layer pairs.

22. The device of claim 21 wherein the layer pairs have a periodicity of about 2 nm to 100 nm.

23. The device of claim 16 wherein the incremental height of each level of the multiple levels of the cured material ranges from 1 nm to 20 nm.

24. The device of claim 16 wherein the number of levels in the cured material is in the range of about 3 to 31.

25. The device of claim 16 wherein the cured material is photoresist.

26. The device of claim 16 wherein the incremental step heights of the relief profile in the layer of cured material are small relative to the intrinsic roughness of the cure material.

27. The device of claim 16 wherein the cured material is a low dielectric constant material.

28. The device of claim 27 wherein the low dielectric constant material is selected from the group of materials consisting of spin on glass, benzocyclobutine, and hydrogen silsesquioxane.

29. The device of claim 16 which is fabricated by a process comprising the steps of:
 (a) providing a substrate;
 (b) depositing a layer of curable material on a surface of the substrate;
 (c) creating a relief profile of cured material from the layer of curable material wherein the relief profile comprises multiple levels of cured material that has a defined contour; and
 (d) depositing a multilayer reflection film over the relief profile wherein the film has an outer contour that substantially matches that of the relief profile.

30. The device of claim 29 wherein the curable material comprises photoresist and step (c) comprises the steps of: (i) exposing the layer of photoresist to spatially varying doses of radiation; and (ii) developing the photoresist to generate a layer of partially-cleared photoresist.

31. The device of claim 30 wherein the radiation comprises electron beam radiation.

32. The device of claim 29 wherein the curable material comprises a low dielectric constant material and step (c) comprises the steps of:
 (i) exposing the layer of low dielectric constant material to spatially varying doses of radiation to selectively modulate its dissolution rate with respect to a solvent; and
 (ii) dissolving the low dielectric constant material for a sufficient length of time such that a relief structure is produced in the low-dielectric-constant material, where the relief structure depth is proportional to the modulated dissolution rate in step (i).

33. The device of claim 32 wherein the low dielectric constant material is selected from the group of materials consisting of spin on glass, benzocyclobutine, and hydrogen silsesquioxane.

34. The device of claim 33 wherein the radiation comprises electron beam radiation.

35. A method of fabricating a multilevel EUV optical element comprising:
 (a) providing a substrate;
 (b) depositing a layer of curable material on a surface of the substrate;
 (c) creating a relief profile in a layer of cured material from the layer of curable material wherein the relief profile comprises multiple levels of cured material that has a defined contour; and
 (d) depositing a multilayer reflection film over the relief profile wherein the film has an outer contour that substantially matches that of the relief profile wherein the incremental step heights of the relief profile in the layer of cured material are small relative to the intrinsic roughness of the cured material.

36. The method of claim 35 wherein the multilayer reflection film comprises alternating layers of a first material having a refractive index and a second material having a different refractive index than the first material.

37. The method of claim 35 wherein the multilayer reflection film comprises about 10 to 200 layer pairs.

38. The method of claim 37 wherein the layer pairs have a periodicity of about 2 nm to 100 nm.

39. The method of claim 35 wherein the multilayer reflection film comprises alternating layers of molybdenum and silicon.

40. The method of claim 39 wherein the multilayer reflection film comprises about 10 to 200 layer pairs.

41. The method of claim 40 wherein the layer pairs have a periodicity of about 2 nm to 100 nm.

42. The method of claim 35 wherein the curable material comprises photoresist and step (c) comprises the steps of: (i) exposing the layer of photoresist to spatially varying doses of radiation; and (ii) developing the photoresist to generate a layer of partially-cleared photoresist.

43. The method of claim 42 wherein the radiation comprises electron beam radiation.

44. The method of claim 35 wherein the curable material comprises a low dielectric constant material and step (c) comprises the steps of:
 (i) exposing the layer of low dielectric constant material to spatially varying doses of radiation to selectively modulate its dissolution rate with respect to a solvent; and
 (ii) dissolving the low dielectric constant material for a sufficient length of time such that a relief structure is produced in the low-dielectric-constant material, where the relief structure depth is proportional to the modulated dissolution rate in step (i).

45. The method of claim 44 wherein the low dielectric constant material is selected from the group of materials consisting of spin on glass, benzocyclobutine, and hydrogen silsesquioxane.

46. The method of claim 45 wherein the radiation comprises electron beam radiation.

47. The method of claim 35 wherein the incremental height of each level of the multiple levels of the cured material ranges from 1 nm to 20 nm.

48. The method of claim 35 wherein the number of levels in the cured material is in the range of about 3 to 31.

49. An EUV device including a multilevel element that comprises:
 (a) a substrate having a layer of a cured material deposited on a surface of the substrate wherein the layer of cured material defines a relief profile comprising multiple levels of cured material that has a defined contour; and
 (b) a multilayer reflection film that covers the relief profile wherein the film has a contour that substantially matches that of the relief profile wherein the incremental step heights of the relief profile in the layer of cured material are small relative to the intrinsic roughness of the cured material.

50. The device of claim 49 wherein the multilayer film comprises alternating layers of a first material having a refractive index and a second material having a refractive index than is different from that of the first material.

51. The device of claim 49 wherein the multilayer reflection film comprises alternating layers of molybdenum and silicon.

52. The device of claim 51 wherein the multilayer reflection film comprises about 10 to 200 layer pairs.

53. The device of claim 52 wherein the layer pairs have a periodicity of about 2 nm to 100 nm.

54. The device of claim 49 wherein the multilayer reflection film comprises about 10 to 200 layer pairs.

55. The device of claim 54 wherein the layer pairs have a periodicity of about 2 nm to 100 nm.

56. The device of claim 49 wherein the incremental height of each level of the multiple levels of the cured material ranges from 1 nm to 20 nm.

57. The device of claim 49 wherein the number of levels in the cured material is in the range of about 3 to 31.

58. The device of claim 49 wherein the cured material is photoresist.

59. The device of claim 49 wherein the cured material is a low dielectric constant material.

60. The device of claim 59 wherein the low dielectric constant material is selected from the group of materials consisting of spin on glass, benzocyclobutine, and hydrogen silsesquioxane.

61. The device of claim 49 which is fabricated by a process comprising the steps of:
(a) providing a substrate;
(b) depositing a layer of curable material on a surface of the substrate;
(c) creating a relief profile of cured material from the layer of curable material wherein the relief profile comprises multiple levels of cured material that has a defined contour; and
(d) depositing a multilayer reflection film over the relief profile wherein the film has an outer contour that substantially matches that of the relief profile.

62. The device of claim 61 wherein the curable material comprises photoresist and step (c) comprises the steps of: (i) exposing the layer of photoresist to spatially varying doses of radiation; and (ii) developing the photoresist to generate a layer of partially-cleared photoresist.

63. The device of claim 62 wherein the radiation comprises electron beam radiation.

64. The device of claim 61 wherein the curable material comprises a low dielectric constant material and step (c) comprises the steps of:
(i) exposing the layer of low dielectric constant material to spatially varying doses of radiation to selectively modulate its dissolution rate with respect to a solvent; and
(ii) dissolving the low dielectric constant material for a sufficient length of time such that a relief structure is produced in the low-dielectric-constant material, where the relief structure depth is proportional to the modulated dissolution rate in step (i).

65. The device of claim 64 wherein the low dielectric constant material is selected from the group of materials consisting of spin on glass, benzocyclobutine, and hydrogen silsesquioxane.

66. The device of claim 65 wherein the radiation comprises electron beam radiation.

* * * * *